(12) United States Patent
Li (10) Patent No.: US 9,531,396 B1
(45) Date of Patent: Dec. 27, 2016

(54) FREQUENCY TUNING DEVICE (71) Applicant: TAIWAN SEMICONDUCTOR MANUFACTURING CO., LTD., Hsinchu (TW)

(72) Inventor: Chao-Chieh Li, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/941,157

(22) Filed: Nov. 13, 2015

(51) Int. Cl.
　　H03B 5/12　　(2006.01)
　　H03L 7/24　　(2006.01)
　　H03L 7/099　　(2006.01)
　　H03L 7/10　　(2006.01)
　　H03B 1/00　　(2006.01)

(52) U.S. Cl.
　　CPC . H03L 7/24 (2013.01); H03B 1/00 (2013.01); H03B 5/1212 (2013.01); H03B 5/1228 (2013.01); H03L 7/099 (2013.01); H03L 7/10 (2013.01)

(58) Field of Classification Search
　　CPC .............. H03L 7/24; H03L 7/099; H03L 7/10; H03B 5/1212; H03B 5/1228; H03B 1/00
　　USPC ...... 331/179, 167, 36 C, 177 V, 117 FE, 1 R
　　See application file for complete search history.

(56) References Cited

U.S. PATENT DOCUMENTS

| | | | |
|---|---|---|---|
| 8,698,565 B2 * | 4/2014 | Obkircher | H03L 7/099 331/1 R |
| 2016/0056762 A1 * | 2/2016 | Ximenes | H03B 5/1265 331/117 FE |

* cited by examiner

Primary Examiner — Arnold Kinkead
(74) Attorney, Agent, or Firm — Maschoff Brennan (57) ABSTRACT

A device is disclosed that includes an oscillator, a frequency detector, and a selection circuit. The oscillator is configured to generate an oscillating signal. The oscillator includes a first tuning bank and a second tuning bank. The first tuning bank is configured to adjust the frequency of the oscillating signal within a first frequency band. The second tuning bank is configured to adjust the frequency of the oscillating signal within a second frequency band. The frequency detector is configured to generate a control signal according to at least one signal indicating the frequency of the oscillating signal. The selection circuit is configured to activate at least one of the first tuning bank and the second tuning bank according to the control signal.

19 Claims, 6 Drawing Sheets

FREQUENCY TUNING DEVICE

BACKGROUND

Oscillators have been widely utilized in various electronic devices. For example, the oscillator is applied to memory devices or data transmitting systems, to provide a clock signal having a desired frequency. However, due to process, voltage, and/or temperature (PVT) variations, the oscillator would have a non-linear gain. As result, the performance and the accuracy of the memory devices are reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1:
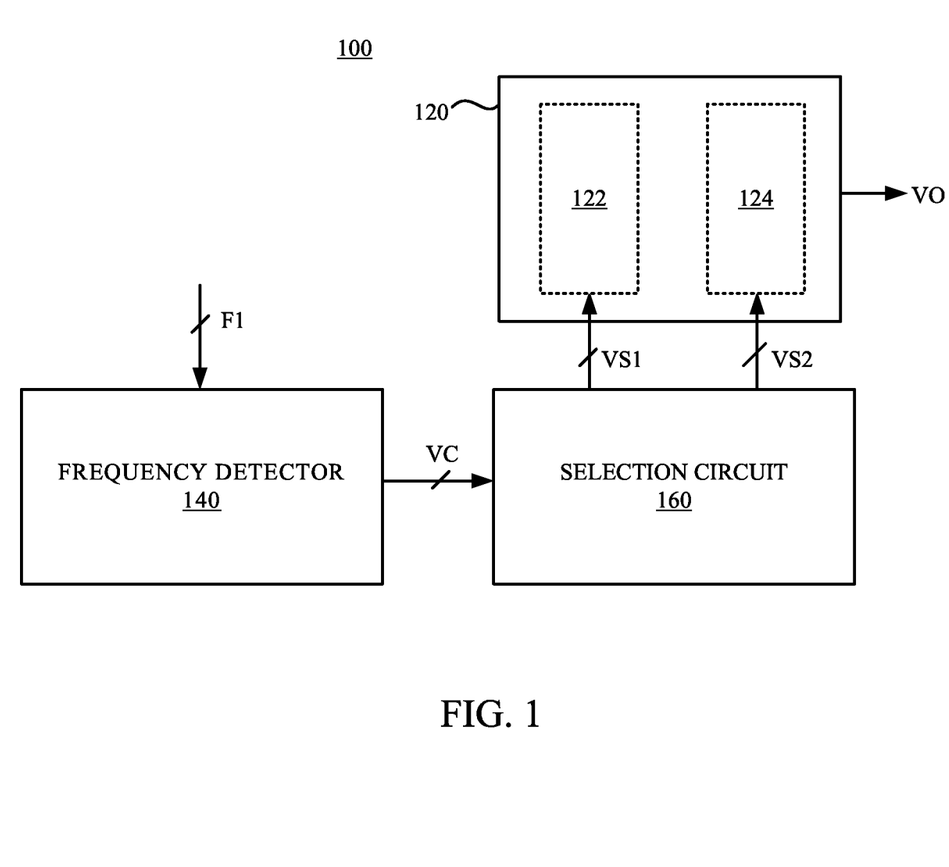
FIG. 1 is a schematic diagram of a device, in accordance with some embodiments of the present disclosure.

Reference is now made to FIG. 1. FIG. 1 is a schematic diagram of a device 100, in accordance with some embodiments of the present disclosure. In some embodiments, the device 100 is applied in an all-digital phase locked loop (ADPLL) system. In some embodiments, the device 100 is configured to operate as a digital-controlled oscillator.

As illustratively shown in FIG. 1, the device 100 includes an oscillator 120, a frequency detector 140, and a selection circuit 160. The oscillator 120 is configured to be controlled by the selection circuit 160, to generate an oscillating signal VO. In some embodiments, the oscillator 120 includes a tuning bank 122 and a tuning bank 124. The tuning bank 122 is configured to adjust the frequency of the oscillating signal VO within a first frequency band. The tuning bank 124 is configured to adjust the frequency of the oscillating signal within a second frequency band. In some embodiments, the second frequency band is configured to be higher than the first frequency band. Effectively, the frequency range of the oscillating signal VO is divided by the tuning bank 122 and the tuning bank 124. In some embodiments, a frequency range of the first frequency band is partially overlapped with a frequency range of the second frequency band. For example, the first frequency band ranges from about 9-17 gigahertz (GHz), the second frequency band ranges from about 16-19 GHz, in which a overlapped frequency range therebewteen is about 1 GHz.

The arrangements and the values of the first frequency band, the second frequency band, and the overlapped frequency range are given for illustrative purposes only. Various arrangements and the values of the first frequency band, the second frequency band, and the overlapped frequency range are within the contemplated scope of the present disclosure.

The frequency detector 140 is configured to detect at least one signal F1, and accordingly generate a control signal VC. In various embodiments, the least one signal F1 includes signals that are sufficient to indicate the frequency of the oscillating signal VO. In some embodiments, the at least one signal F1 includes frequency control words, used for calibrating the frequency of the oscillating signal VO, in the ADPLL system. In some further embodiments, frequency control words includes a control code utilized to calibrate process, voltage, and temperature (PVT) variations, a control code utilized to select a band of the frequency of the oscillating signal VO, a control code utilized in coarse-tuning, and/or a control code utilized in fine-tuning. In some embodiments, the at least one signal F1 includes data outputted from a reference accumulator and/or a variable accumulator in the ADPLL system. In some other embodiments, the at least one signal F1 includes data outputted from a time-to-digital converter (TDC). In some embodiments, the at least one signal F1 includes a signal outputted from a monitor circuit that is used to detect the frequency of the oscillating signal VO. In some alternative embodiments, the at least one signal F1 includes a control voltage from an analog PLL system.

The arrangements of the signal F1 are given for illustrative purposes. Various arrangements of the signal F1, which are able to present the frequency of the oscillating signal VO, are with the contemplated scoped of the present disclosure.

The selection circuit 160 is coupled between the frequency detector 140 and the oscillator 120. In some embodiments, the selection circuit 160 is configured to output a selection signal VS1 and a selection signal VS2, according to the control signal VC, to activate at least one of the tuning bank 122 and the tuning bank 124. In some embodiments, the selection signal VS1 and the selection signal VS2 are multi-bit signals. In some embodiments, multi-bit signals are in a form of a binary code. In some other embodiments, the multi-bit signals are in a form of a thermometer code. With such arrangements, the frequency of the oscillating signal VO is able to be automatically adjusted. In some other embodiments, the selection signals VS1-VS2 are generated by a logical or arithmetical operations of the control signal VC and the at least one signal F1. In some embodiments, the selection signals VS1-VS2 are generated by a logical or arithmetical operations of the control signal VC and different bits of the at least one signal F1.

Figure 2:
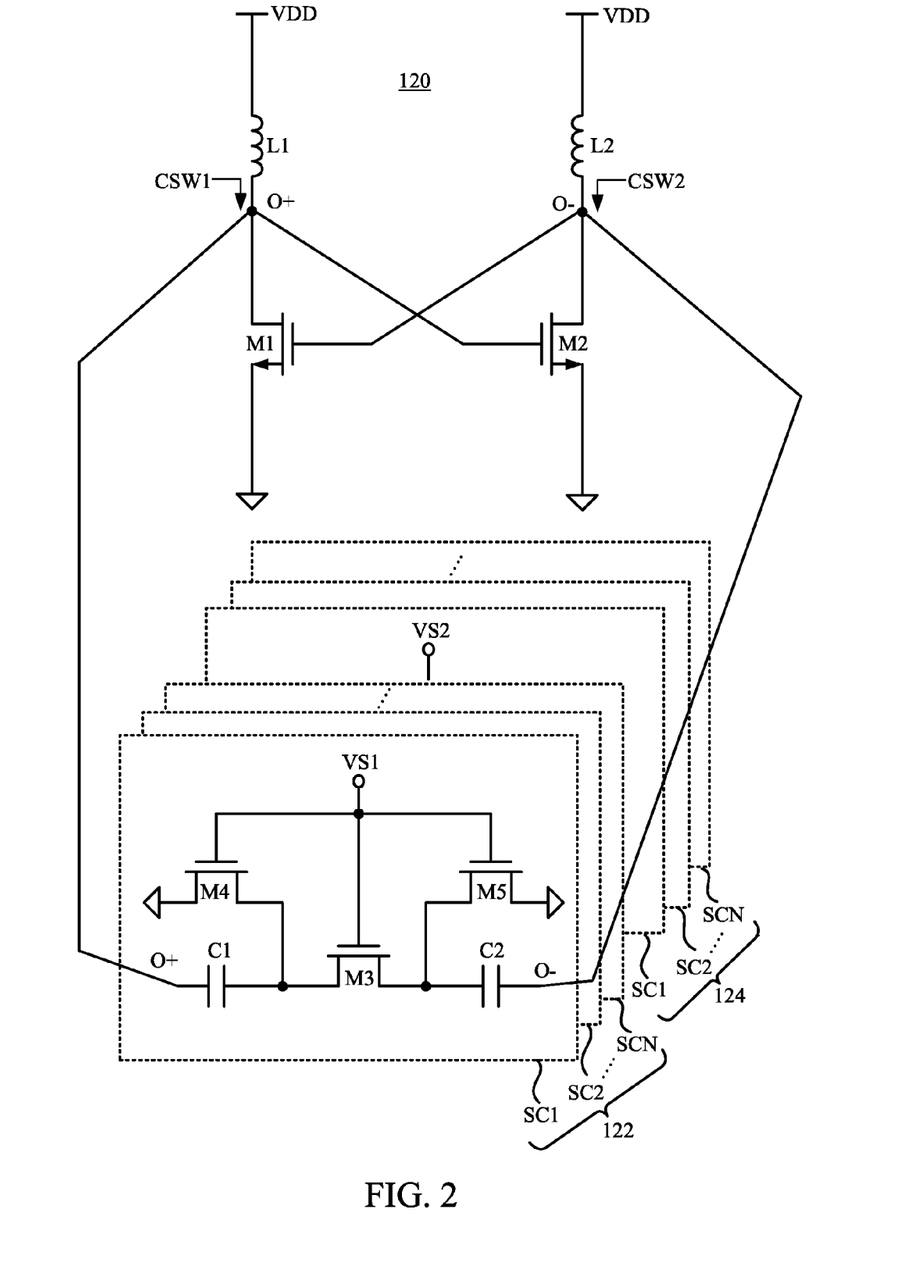
FIG. 2 is a schematic diagram of the oscillator in FIG. 1, in accordance with some embodiments of the present disclosure.

Reference is now made to FIG. 2. FIG. 2 is a schematic diagram of the oscillator 120 in FIG. 1, in accordance with some embodiments of the present disclosure. With respect to the embodiments of FIG. 1, like elements in FIG. 2 are designated with the same reference numbers for ease of understanding.

In some embodiments, the oscillator 120 includes a LC-based oscillator. For illustration of FIG. 2, compared with FIG. 1, the oscillator 120 further includes inductors L1-L2, cross-coupled pair of switches M1-M2. The inductor L1 is coupled between a power source, that is configured to provide a voltage VDD, and a node O+. The inductor L2 is coupled between the power source and a node O−. The switch M1 is coupled between the node O+ and the ground, in which a control terminal of the switch M1 is coupled to the node O−. The switch M2 is coupled between the node O− and the ground, in which a control terminal of the switch M2 is coupled to the node O+. The tuning bank 122 and the tuning bank 124 are coupled between the node O+ and the node O−. In some embodiments, the inductance value of the inductor L1 is configured to be the same as the inductance value of the inductor L2.

In some embodiments, each of the tuning bank 122 and the tuning bank 124 includes switch capacitor circuits SC1-SCN. For simplicity, FIG. 2 only illustrates the circuit diagram of the switch capacitor circuit SC1 in the tuning bank 122, and the circuit architectures of the switch capacitor circuits SC2-SCN in the tuning bank 122 and those in the tuning bank 124 are the same as the switch capacitor circuit SC1 in the tuning bank 122. In some embodiments, the switch capacitor circuit SC1 includes switches M3-M5 and capacitors C1-C2. In some embodiments, the capacitance value of the capacitor C1 is configured to be the same as the capacitance value of the capacitor C2.

A first terminal of the capacitor C1 is coupled to the node O+, and a second terminal of the capacitor C1 is coupled to a first terminal of the switch M3. A first terminal of the capacitor C2 is coupled to a second terminal of the switch M3, and a second terminal of the capacitor C2 is coupled to the node O−. The switch M4 is coupled between the second terminal of the capacitor C1 and the ground. The switch M5 is coupled between the first terminal of the capacitor C2 and the ground. The switches M3-M5 of the switch capacitor circuits SC1-SCN in the tuning bank 122 are configured to be turned on according to the selection signal VS1. The switches M3-M5 of the switch capacitor circuits SC1-SCN in the tuning bank 124 are configured to be turned on according to the selection signal VS2. When the switch M3 is turned on, the capacitor C1 is connected to the capacitor C2. When the switch M4 is turned on, the second terminal of the capacitor C1 is connected to the ground. When the switch M5 is turned on, the first terminal of the capacitor C2 is connected to the ground.

In some embodiments, a resonant is occurred between the inductor L1 and an equivalent capacitance CSW1 that is coupled to the inductor L1, and a resonant is occurred between the inductor L2 and an equivalent capacitance CSW2 that is coupled to the inductor L2, in order to generate the oscillating signal VO between the node O+ and the node O−. In some embodiments, the equivalent capacitance CSW1 and the equivalent capacitance CSW2 are determined according to operating statues of the switch capacitor circuits SC1-SCN. Accordingly, with different operating statues of the switch capacitor circuits SC1-SCN, each of the switch capacitor circuits SC1-SCN is able to provide a certain range of the frequency of the oscillating signal VO. Explained in a different way, the gain of the oscillator 120 is able to adjusted by turning on or off the switch capacitor circuits SC1-SCN.

In some embodiments, the tuning bank 122 and the tuning bank 124 are applied in a fine-tuning of the oscillator 120. For illustration, the switch capacitor circuits SC1-SCN are formed with a symmetrical architecture, the capacitance value of the equivalent capacitance CSW1 is about the same as the capacitance value of the equivalent capacitance CSW2. Therefore, for simplicity, the following descriptions are given with reference to the equivalent capacitance CSW1.

As described above, the frequency of the oscillating signal VO is adjusted with the resonant occurred in the switch capacitor circuits SC1-SCN. The resolution $\Delta f_{FINE}$, for fine-tuning the gain of the oscillator 120, of the switch capacitor circuit SC1 is able to be expressed as the following equation (1):

$$\Delta f_{FINE} = \frac{1}{\sqrt{L(C_{par} + C_{sw})}} - \frac{1}{\sqrt{L(C_{par} + C_{sw} + \Delta C_{FINE})}} \quad (1)$$

Where L is the inductance value of the inductors L1-L2, Cpar is parasitic capacitances in the switch capacitor circuit SC1, $C_{SW}$ is one of the equivalent capacitance CSW1 and the equivalent capacitance CSW2, and $\Delta C_{FINE}$ is an unity variation of the capacitance of the switch capacitor circuit SC1.

When the switches M3-M5 in the switch capacitor circuit SC1 are turned on, the corresponding capacitance value of $C_{SW}$ is denoted as $C_{SW\_ON}$ hereinafter. Alternatively, when the switches M3-M5 in the switch capacitor circuit SC1 are turned off, the corresponding capacitance value of $C_{SW}$ is denoted as $C_{SW\_OFF}$ hereinafter. In some embodiments, when the capacitance value of $C_{SW}$ is much greater than the capacitance value of parasitic capacitances Cpar, the equation (1) is able to be simplified as the following equation (2):

$$\Delta f_{FINE\_Min} = \frac{1}{\sqrt{LC_{sw\_on}}} - \frac{1}{\sqrt{L(C_{sw\_on} + \Delta C_{FINE})}} \quad (2)$$

$$\Delta f_{FINE\_Min} = \frac{1}{\sqrt{LC_{sw\_off}}} - \frac{1}{\sqrt{L(C_{sw\_off} + \Delta C_{FINE})}}$$

Where $\Delta f_{FINE\_Min}$ is the minimum resolution of the switch capacitor circuit SC1, and the $\Delta f_{FINE\_Max}$ is the maximum resolution of the switch capacitor circuit SC1.

Thus, if the value of $C_{SW}$ is much greater than the parasitic capacitances Cpar, a relationship between $\Delta f_{FINE\_Max}$ and $\Delta f_{FINE\_Min}$ is able to be derived as the following equation (3):

$$\frac{\Delta f_{FINE\_Max}}{\Delta f_{FINE\_Min}} = 2 \cdot \frac{C_{sw\_on}}{C_{sw\_off}} \qquad (3)$$

As described above, each of the switch capacitor circuit SC1-SCN has the capacitance $C_{SW\_ON}$ when the switches M1-M3 thereof are turned on, and each of the switch capacitor circuit SC1-SCN has the capacitance $C_{SW\_OFF}$ when the switches M1-M3 thereof are turned off. By utilizing the equation (3), in various embodiments, the first frequency band and the second frequency band are able to be determined according to the relationships of about two times of a ratio between the capacitance $C_{SW\_ON}$ and the capacitance $C_{SW\_OFF}$.

For illustration, with continued reference to FIG. 2, when the switches M3-M5 are turned off, the equivalent capacitance CSW1, i.e., the capacitance $C_{SW\_OFF}$, is substantially formed by parasitic capacitances (not shown) coupled to the second terminal of the capacitor C1 and gate-source capacitance (not shown) of the switch M3. When the switches M3-M5 are turned on, the second terminal of the capacitor C1 is coupled to the ground via the switch M4. Thus, when the switches M3-M5 are turned on, the equivalent capacitance CSW1, i.e., the capacitance $C_{SW\_ON}$, is substantially formed by the capacitor C1. Thus, by choosing the sizes of the switch M3-M5 and the capacitor C1, the ratio between the capacitance $C_{SW\_ON}$ and the capacitance $C_{SW\_OFF}$ is able to be determined. Effectively, the first frequency band and the second frequency band are able to be linearly determined. For example, when the ratio between the capacitance $C_{SW\_ON}$ and the capacitance $C_{SW\_OFF}$ is set to be about 1, the value derived from the equation (3) is about 2. Accordingly, the resolution of the second frequency band is designed to be in a range of, for example, about 4-8 million Hertz (MHZ). The values of the fine-tune resolution and the frequency bands are given for illustrative purposes only. Various values of the fine-tune resolution and the frequency bands are within the contemplated scoped of the present disclosure.

In some approaches, the gain of the oscillator is nonlinear. In other words, the gain of the oscillator in such approaches involves a calculation of a quadratic equation, which requires complex analysis. Compared with the aforementioned approaches, by utilizing the equation (3) above, the configurations of the first frequency band and the second frequency band are able to be set in much higher efficiency.

Figure 3:
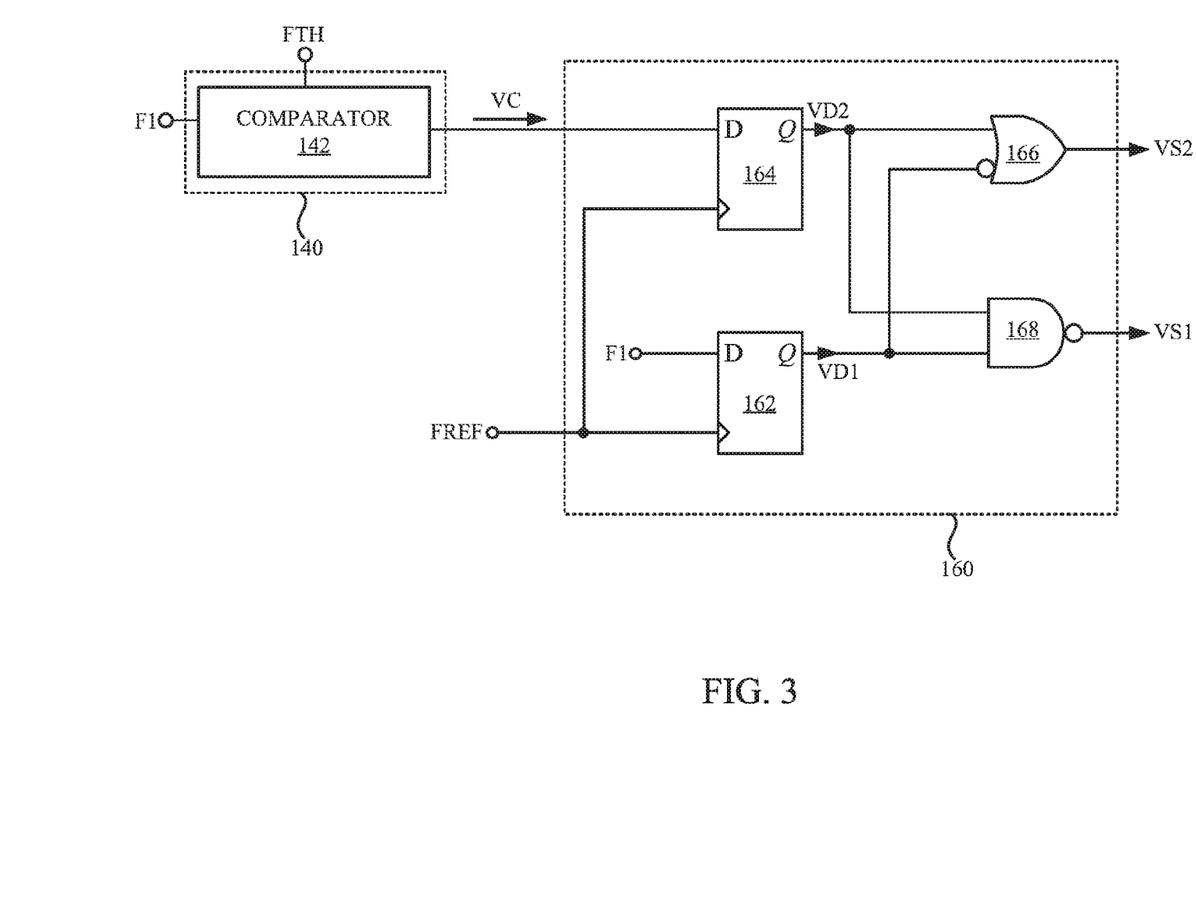
FIG. 3 is a circuit diagram of the frequency detector in FIG. 1 and the selection circuit in FIG. 1, in accordance with some embodiments of the present disclosure.

Reference is now made to FIG. 3. FIG. 3 is a circuit diagram of the frequency detector 140 in FIG. 1 and the selection circuit 160 in FIG. 1, in accordance with some embodiments of the present disclosure. With respect to the embodiments of FIG. 1 and FIG. 2, like elements in FIG. 3 are designated with the same reference numbers for ease of understanding.

Figure 5:
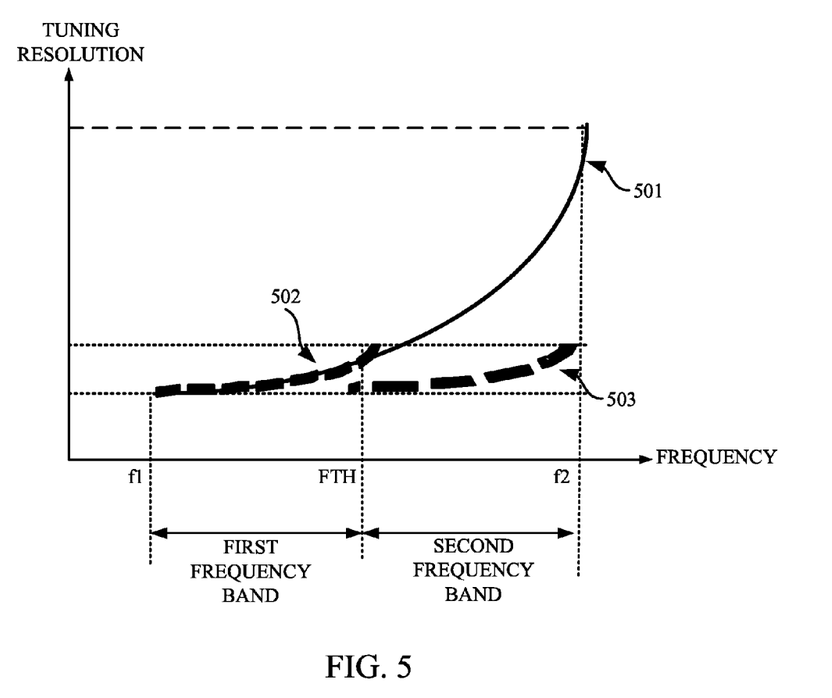
FIG. 5 illustrates the relationship between the fine-tune resolution of the switch capacitor circuit in FIG. 2 and the frequency of the oscillating signal VO in FIG. 1, in accordance with some embodiments of the present disclosure.

As illustratively shown in FIG. 3, in some embodiments, the frequency detector 140 includes a comparator 142. The comparator 142 is configured to compare the at least one signal F1 with a threshold frequency FTH, to generate the control signal VC. In some embodiments, the threshold frequency FTH is a boundary between the first frequency band and the second frequency band, for example, as illustrated in FIG. 5 below.

In some embodiments, the selection circuit 160 includes flip-flops 162 and 164, an OR gate 166 having an inverting input terminal, and a NAND gate 168. The flip-flop 162 is configured to output a detect signal VD1 according to a reference frequency FREF and the at least one signal F1, which includes, for example, fine-tune signals. In some embodiments, the detect signal VD1 is a multi-bit signal. The flip-flop 164 is configured to output a detect signal VD2 according the reference frequency FREF and the control signal VC. The inverting input terminal of the OR gate 166 is configured to receive the detect signal VD1, another input terminal of the OR gate 166 is configured to receive the detect signal VD2, and an output terminal of the OR gate 166 is configured to output the selection signal VS2. The NAND gate 168 is configured to output the selection signal VS1 according to the detect signal VD1 and the detect signal VD2. With such arrangements, when the frequency of the oscillating signal VO is desired to exceed threshold frequency FTH, the tuning bank 124 is able to be activated by the selection signal VS2. As a result, the frequency of the oscillating signal VO is able to be linearly adjusted in a higher frequency range.

The arrangements and implementations of the frequency detector 140 and the selection circuit 160 are given for illustrative purposes. Various arrangements and implementations of the frequency detector 140 and the selection circuit 160 are within the contemplated scoped of the present disclosure.

Figure 4:
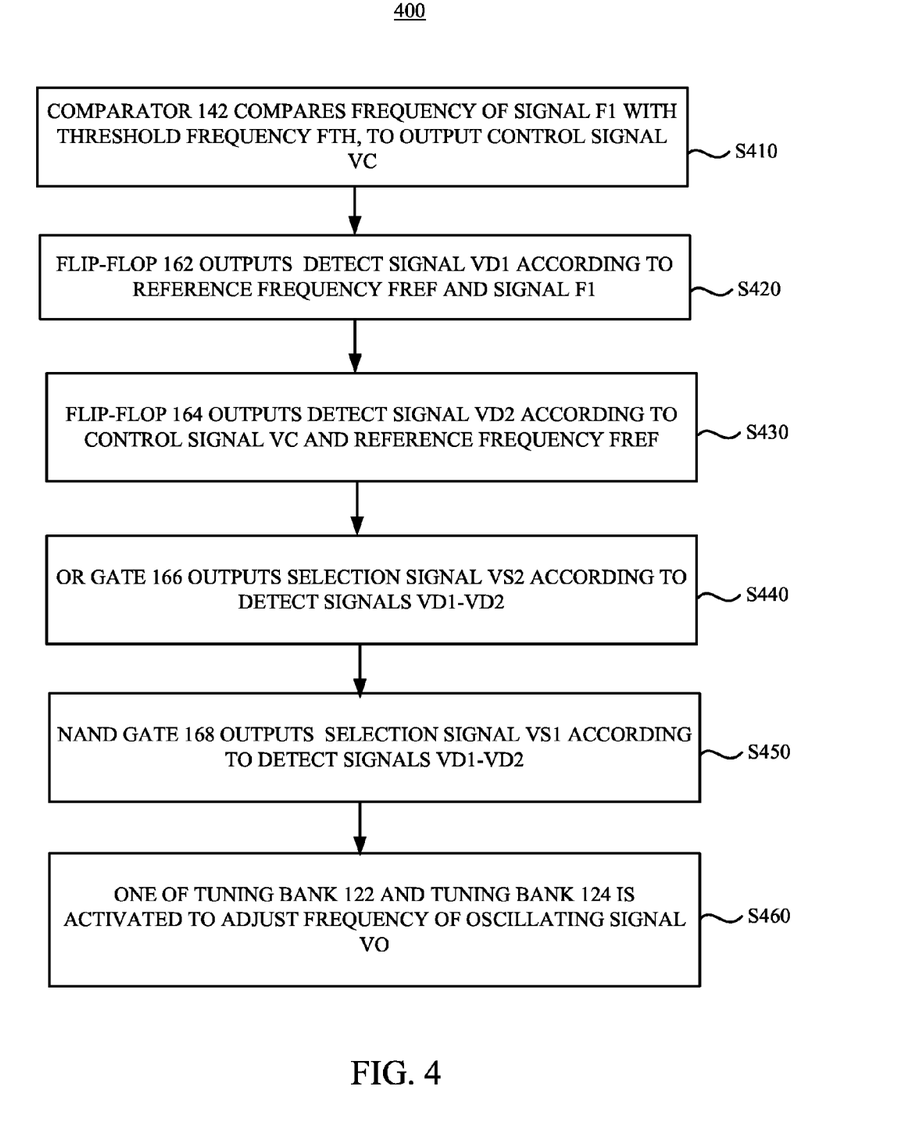
FIG. 4 is a flow chart of a method of calibrating the frequency of an oscillator, in accordance with some embodiments of the present disclosure.

FIG. 4 is a flow chart of a method 400 of calibrating the frequency of an oscillator, in accordance with some embodiments of the present disclosure. For ease of understanding, reference is now made to FIGS. 1-4, and the operations of the method 400 are described with the device 100 in FIG. 1. In some embodiments, the method 400 includes operations S410-S460.

In operations S410, the comparator 142 compares the frequency of the signal F1 with the threshold frequency FTH, to output the control signal VC. In operation S420, the flip-flop 162 outputs the detect signal VD1 according to the reference frequency FREF and the signal F1. In operation S430, the flip-flop 164 outputs the detect signal VD2 according to the control signal VC and the reference frequency FREF.

FIG. 5 illustrates the relationship between the fine-tune resolution of the switch capacitor circuit SC1-SCN in FIG. 2 and the frequency of the oscillating signal VO in FIG. 1, in accordance with some embodiments of the present disclosure.

For example, as illustrated in some embodiments of FIG. 5, the first frequency band is in a range of a frequency f1 to the threshold frequency FTH, and the second frequency band is in a range of the threshold frequency FTH to a frequency f2. When the frequency of the signal F1 is lower than the threshold frequency FTH, the comparator 142 outputs the control signal VC having a logic value of 0. Under this circumstance, the flip-flop 162 outputs the detect signal VD1 having a logic value of 1, and the flip-flop 164 outputs the detect signal VD2 outputs the detect signal VD2 having the logic value of 0. Alternatively, when the frequency of the signal F1 is higher than the threshold frequency FTH, the comparator 142 outputs the control signal VC having the logic value of 1. Under this circumstance, the flip-flop 162 outputs the detect signal VD1 having a logic value of 0, the flip-flop 164 outputs the detect signal VD2 having the logic value of 1.

With continued reference to FIG. 4, in operation S440, the OR gate 166 outputs the selection signal VS2 according to the detect signals VD1-VD2. In operation S450, the NAND gate 168 outputs the selection signal VS1 according to the detect signals VD1-VD2.

For example, as described above, when the frequency of the signal F1 is lower than the threshold frequency FTH, i.e., the frequency of the oscillating signal VO is currently within the first frequency band, the detect signal VD2 has the logic value of 0. Accordingly, the NAND gate 168 outputs the selection signal VS1 having the logic value of 1, and the OR gate 166 outputs the selection signal VS2 having the logic value of 0. Alternatively, when the frequency of the signal F1 is higher than the threshold frequency FTH, i.e., the frequency of the oscillating signal VO is currently within the second frequency band, the detect signal VD2 has the logic value of 1. Accordingly, the NAND gate 168 outputs the selection signal VS1 having the logic value of 0, and the OR gate 166 outputs the selection signal VS2 having the logic value of 1.

With continued reference to FIG. 4, in operation S460, one of the tuning bank 122 and the tuning bank 124 is activated to adjust the frequency of the oscillating signal VO.

For example, as described above, when the frequency of the oscillating signal VO is currently within the first frequency band, the selection signal VS1 has the logic value of 1, and the selection signal VS2 has the logic value of 0. Accordingly, the switch capacitor circuits SC1-SCN in the tuning bank 122 are selected to adjust the frequency of the oscillating signal VO. Alternatively, when the frequency of the oscillating signal VO is currently within the second frequency band, the selection signal VS1 has the logic value of 0, and the selection signal VS2 has the logic value of 1. Accordingly, the switch capacitor circuits SC1-SCN in the tuning bank 124 are selected to adjust the frequency of the oscillating signal VO.

The above description of the method 400 includes exemplary operations, but the operations of the method 400 are not necessarily performed in the order described. The order of the operations of the method 400 disclosed in the present disclosure are able to be changed, or the operations are able to be executed simultaneously or partially simultaneously as appropriate, in accordance with the spirit and scope of various embodiments of the present disclosure. For example, in some other embodiment, the tuning bank 122 and the tuning bank 124 are simultaneously turned on, in order to further extend the tuning range of the frequency of the oscillating signal VO.

In some approaches, as a curve 501 illustrated in FIG. 5, the oscillator has a non-linearity characteristic in the fine-tune resolution. Compared with such approaches, as shown in curves 502-503 in FIG. 5, the frequency range of the oscillating signal VO falls within one of the first frequency band and the second frequency band, in which the curve 502 corresponds to the first frequency band, and the curve 503 corresponds to the second frequency band. Effectively, the gain of the oscillator 120 in FIG. 1 is compensated with the arrangements of the first frequency band and the second frequency band. As a result, the linearity of the oscillator 120 is improved.

Figure 6:
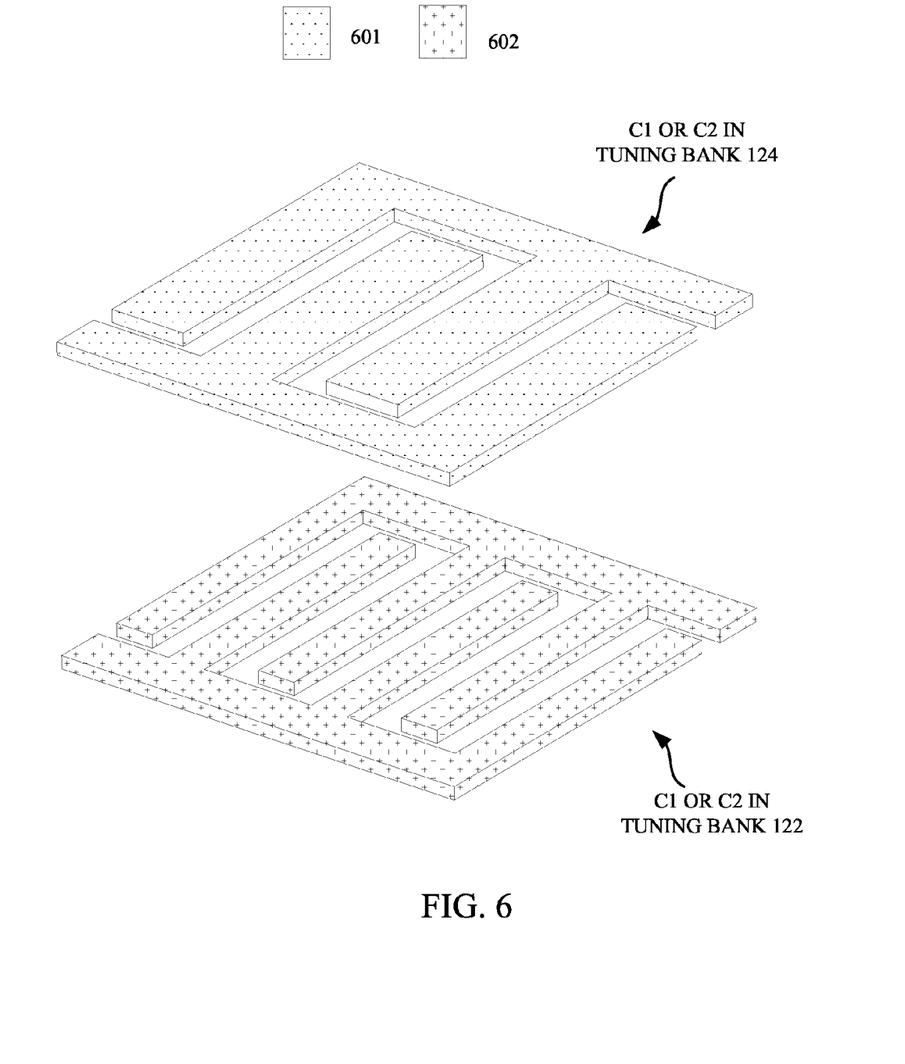
FIG. 6 is a schematic diagram of a formation of the capacitors in the oscillator in FIG. 2, in accordance with some embodiments of the present disclosure.

Reference is now made to FIG. 6. FIG. 6 is a schematic diagram of a formation of the capacitors C1-C2 in the oscillator 120 in FIG. 2, in accordance with some embodiments of the present disclosure. With respect to the embodiments of FIG. 2, like elements in FIG. 6 are designated with the same reference numbers for ease of understanding.

In some embodiments, as illustratively shown in FIG. 6, the capacitors C1-C2 in FIG. 2, in the switch capacitor circuits SC1-SCN of each one of the tuning banks 122 and 124 in FIG. 2, are formed with a multi-finger architecture. For example, in some embodiments, the capacitors C1-C2 are formed with metal-insulator-metal (MIM) capacitors. In some other embodiments, the capacitors C1-C2 are formed with metal-oxide-metal (MOM) capacitors.

Furthermore, in some embodiments, as illustratively shown in FIG. 6, the capacitors C1-C2 in the tuning bank 124 are formed on the capacitors C1-C2 in the tuning bank 122. For example, the capacitors C1-C2 in the tuning bank 124 are formed with the multi-finger architecture using a metal layer 601, and the capacitors C1-C2 in the tuning bank 122 are formed with the multi-finger architecture using a metal layer 602. The multi-finger architecture using the metal layer 601 are formed and stacked on the multi-finger architecture using the metal layer 602. With the arrangements of stacking the capacitors C1-C2, the size of the tuning banks 122 and 124 are able to be reduced. In some other embodiments, the capacitors C1-C2 in the tuning bank 122 are formed on the capacitors C1-C2 in the tuning bank 124.

The arrangements and the implementations of the capacitors C1-C2 are given for illustrative purposes only. Various arrangements and the implementations of the capacitors C1-C2 are within the contemplated scope of the present disclosure. For example, in some other embodiments, the capacitors C1-C2 in the tuning banks 122 and 124 are formed with horizontal distributed multi-finger capacitors.

For ease of understanding, the embodiments illustrated above are described with two tuning banks 122 and 124. In various embodiments, various numbers, including, for example, any integer greater than or equal to 2, of the tuning banks are able to be applied to the device 100 in FIG. 1. For example, in some other embodiments, the oscillator 120 in FIG. 2 is configured to include three tuning banks, to adjust the frequency of the oscillating signal VO. Correspondingly, the three tuning banks are able to be formed with the multi-finger architectures in FIG. 6, and are stacked on each other. Moreover, in the embodiments illustrated above, the tuning banks 122 and 124 are able to be applied to PVT tuning banks, band tuning banks, coarse-tuning banks, and/or fine-tuning banks in the ADPLL system.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device is disclosed that includes an oscillator, a frequency detector, and a selection circuit. The oscillator is configured to generate an oscillating signal. The oscillator includes a first tuning bank and a second tuning bank. The first tuning bank is configured to adjust the frequency of the oscillating signal within a first frequency band. The second tuning bank is configured to adjust the frequency of the oscillating signal within a second frequency band. The frequency detector is configured to generate a control signal according to at least one signal indicating the frequency of the oscillating signal. The selection circuit is configured to activate at least one of the first tuning bank and the second tuning bank according to the control signal.

Also disclosed is a method that includes the operation below. The at least one signal, indicating a frequency of an oscillating signal outputted from an oscillator, is detected by a frequency detector, to generate a control signal. One of a first tuning bank and a second tuning bank of the oscillator is activated, according to the control signal, by a selection circuit, to adjust the frequency of the oscillating signal, in which the first tuning bank corresponds to a first frequency band, and the second tuning bank corresponds to a second frequency band, and the frequency of the oscillating signal is configured to fall within one of the first frequency band and the second frequency band.

Also disclosed is a device that includes a selection circuit and a first tuning bank, and a second tuning bank. The selection circuit is configured to generate a first selection signal and a second selection signal according to at least one signal indicating a frequency of an oscillating signal. The first tuning bank is configured to generate the oscillating signal within a first frequency band according to the first selection signal. The second tuning bank is configured to generate the oscillating signal within a second frequency band according to the second selection signal. The frequency of the oscillating signal falls within one of the first frequency band and the second frequency band according to the at least one signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    an oscillator configured to generate an oscillating signal, the oscillator comprising:
        a first tuning bank configured to adjust a frequency of the oscillating signal within a first frequency band; and
        a second tuning bank configured to adjust the frequency of the oscillating signal within a second frequency band;
    a frequency detector configured to generate a control signal according to at least one signal indicating the frequency of the oscillating signal; and
    a selection circuit configured to activate at least one of the first tuning bank and the second tuning bank according to the control signal,
    wherein each of the first tuning bank and the second tuning bank comprises a switch capacitor circuit, the switch capacitor circuit is configured to have a first capacitance when the switch capacitor circuit is turned on, and the switch capacitor circuit is configured to have a second capacitance when the switch capacitor circuit is turned off, and the first frequency band and the second frequency band are determined according to about two times of a ratio between the first capacitance and the second capacitance.

2. The device of claim 1, wherein the switch capacitor circuit comprises at least one capacitive unit, the at least one capacitive unit of the second tuning bank is formed and stacked on the at least one capacitive unit of the first tuning bank.

3. The device of claim 2, wherein the at least one capacitive unit is formed with a multi-finger architecture.

4. The device of claim 1, wherein a frequency range of the first frequency band is partially overlapped with a frequency range of the second frequency band.

5. The device of claim 1, wherein the oscillator further comprises:
    an first inductive unit coupled to a first node;
    a second inductive unit coupled to a second node; and
    a cross-coupled pair of switching units coupled to the first node and the second node,
    wherein the first tuning bank and the second tuning bank are coupled between the first node and the second node.

6. The device of claim 5, wherein the switch capacitor circuit is coupled between the first node and the second node, and the switch capacitor circuit comprises:
    a first capacitive unit coupled to the first node;
    a second capacitive unit coupled to the second node;
    a first switching unit configured to be turned on, according to a selection signal, to couple the first capacitive unit with the second capacitive unit;
    a second switching unit configured to be turned on, according to the selection signal, to couple the first capacitive unit to ground; and
    a third switching unit configured to be turned on, according to the selection signal, to couple the second capacitive unit to ground.

7. The device of claim 6, wherein the selection circuit is configured to generate the selection signal, according to the control signal and the at least one signal, to activate at least one of the first tuning bank and the second tuning bank.

8. The device of claim 6, the frequency detector comprises:
    a comparator configured to compare the at least one signal with a threshold frequency, to generate the control signal; and
    a plurality of digital circuits configured to generate the selection signal according to a reference frequency, the control signal and the at least one signal.

9. A method, comprising:
    detecting, by a frequency detector, at least one signal, indicating a frequency of an oscillating signal outputted from an oscillator, to generate a control signal; and
    activating, by a selection circuit, one of a first tuning bank and a second tuning bank of the oscillator, according to the control signal, to adjust the frequency of the oscillating signal,
    wherein the first tuning bank corresponds to a first frequency band, and the second tuning bank corresponds to a second frequency band, and the frequency of the oscillating signal is configured to fall within one of the first frequency band and the second frequency band,
    wherein each of the first tuning bank and the second tuning bank comprises a switch capacitor circuit, and the method further comprises:
    determining the first frequency band and the second frequency band according to about two times of a ratio between a first capacitance and a second capacitance,
    wherein the switch capacitor circuit is configured to have the first capacitance when the switch capacitor circuit is turned on, and the switch capacitor circuit is configured to have the second capacitance when the switch capacitor circuit is turned off.

10. The method of claim 9, wherein activating the one of the first tuning bank and the second tuning bank comprises:
    generating, by the selection circuit, a selection signal according to the control signal, a reference frequency, and the at least one signal, to activate the one of the first tuning bank and the second tuning bank.

11. The method of claim 9, wherein when a frequency of the at least one signal is higher than the first frequency band, the second tuning bank is activated, and when the frequency of the at least one signal is lower than the first frequency band, the first tuning bank is activated.

12. A device, comprising:
a selection circuit configured to generate a first selection signal and a second selection signal according to at least one signal indicating a frequency of an oscillating signal;
a first tuning bank configured to generate the oscillating signal within a first frequency band according to the first selection signal; and
a second tuning bank configured to generate the oscillating signal within a second frequency band according to the second selection signal,
wherein the frequency of the oscillating signal falls within one of the first frequency band and the second frequency band according to the at least one signal,
wherein each of the first tuning bank and the second tuning bank comprises a switch capacitor circuit, the switch capacitor circuit is configured to have a first capacitance when the switch capacitor circuit is turned on, and the switch capacitor circuit is configured to have a second capacitance when the switch capacitor circuit is turned off, and the first frequency band and the second frequency band are determined according to about two times of a ratio between the first capacitance and the second capacitance.

13. The device of claim 12, wherein the switch capacitor circuit comprises at least one capacitive unit, the at least one capacitive unit of the second tuning bank is formed and stacked on the at least one capacitive unit of the first tuning bank.

14. The device of claim 12, further comprising:
a frequency detector configured to generate a control signal according to the at least one signal indicating the frequency of the oscillating signal,
wherein the selection circuit is configured to generate the first selection signal and the second selection signal according to the control signal.

15. The device of claim 12, further comprising:
an first inductive unit coupled to a first node;
a second inductive unit coupled to a second node; and
a cross-coupled pair of switching units coupled to the first node and the second node;
wherein the first tuning bank and the second tuning bank are coupled between the first node and the second node.

16. The device of claim 15, wherein the switch capacitor circuit is coupled between the first node and the second node, and the switch capacitor circuit comprises:
a first capacitive unit coupled to the first node;
a second capacitive unit coupled to the second node;
a first switching unit configured to be turned on, according to the first selection signal, to couple the first capacitive unit with the second capacitive unit;
a second switching unit configured to be turned on, according to the first selection signal, to couple the first capacitive unit to ground; and
a third switching unit configured to be turned on, according to the first selection signal, to couple the second capacitive unit to ground.

17. The device of claim 1, wherein the frequency detector is configured to compare the at least one signal with a threshold frequency to generate the control signal,
wherein the threshold frequency is a boundary between the first frequency band and the second frequency band.

18. The method of claim 9, wherein detecting the at least one signal comprises:
comparing, by a comparator of the frequency detector, the at least one signal with a threshold frequency, to generate the control signal,
wherein the threshold frequency is a boundary between the first frequency band and the second frequency band.

19. The device of claim 12, wherein the selection circuit is configured to generate the first selection signal and the second selection signal according to a control signal, wherein the device further comprises:
a frequency detector configured to compare the at least one signal with a threshold frequency, to generate the control signal,
wherein the threshold frequency is a boundary between the first frequency band and the second frequency band.

* * * * *